United States Patent
Tsujino et al.

(10) Patent No.: US 6,519,194 B2
(45) Date of Patent: Feb. 11, 2003

(54) SEMICONDUCTOR MEMORY DEVICE WITH A RAPID PACKET DATA INPUT, CAPABLE OF OPERATION CHECK WITH LOW SPEED TESTER

(75) Inventors: Mitsunori Tsujino, Hyogo (JP); Kazutoshi Hirayama, Hyogo (JP); Kyoji Yamasaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/941,609

(22) Filed: Aug. 30, 2001

(65) Prior Publication Data

US 2002/0048211 A1 Apr. 25, 2002

Related U.S. Application Data

(62) Division of application No. 09/606,413, filed on Jun. 29, 2000, now Pat. No. 6,301,190.

(30) Foreign Application Priority Data

Jan. 6, 2000 (JP) .......................................... 2000-000859

(51) Int. Cl.[7] .................................................. G11C 7/00
(52) U.S. Cl. ........................................ 365/201; 365/233
(58) Field of Search ................................. 365/201, 233, 365/236, 239, 189.12, 193, 194

(56) References Cited

U.S. PATENT DOCUMENTS

| | | | |
|---|---|---|---|
| 4,862,068 A | * 8/1989 | Kawashima et al. | 324/73 |
| 4,882,710 A | 11/1989 | Hashimoto et al. | 365/189.05 |
| 4,945,518 A | 7/1990 | Muramatsu et al. | 365/233 |
| 5,086,388 A | * 2/1992 | Motoaba et al. | 395/425 |
| 5,422,858 A | 6/1995 | Mizukami et al. | 365/233 |
| 5,426,784 A | 6/1995 | Kawata et al. | 395/800 |
| 5,473,577 A | 12/1995 | Miyake et al. | 365/238 |
| 5,473,758 A | 12/1995 | Allen et al. | 395/430 |
| 5,748,559 A | 5/1998 | Raza et al. | 365/233 |
| 5,986,953 A | 11/1999 | Kim et al. | |

FOREIGN PATENT DOCUMENTS

| | | |
|---|---|---|
| JP | 6-160486 | 6/1994 |
| JP | 11-162200 | 6/1999 |

* cited by examiner

*Primary Examiner*—Richard Elms
*Assistant Examiner*—Anh Phung
(74) *Attorney, Agent, or Firm*—McDermott, Will & Emery

(57) ABSTRACT

A semiconductor memory device uses in a test mode a clock signal from a tester to allow a test clock conversion circuit and a DLL circuit to generate a rapid internal clock. The internal clock is applied to serial-parallel conversion circuits subjecting received, packetized data to serial-parallel conversion, and an interface circuit receiving and decoding outputs from the serial-parallel conversion circuits and outputting a command such as ACT to a DRAM core. Furthermore, an internal packet generation circuit uses the internal clock to rapidly generate a testing packet signal. Thus the device's operation can be checked with a low speed tester, without externally receiving a rapid packet signal.

3 Claims, 14 Drawing Sheets

SEMICONDUCTOR MEMORY DEVICE WITH A RAPID PACKET DATA INPUT, CAPABLE OF OPERATION CHECK WITH LOW SPEED TESTER

This application is a divisional of application Ser. No. 09/606,413 filed Jun. 29, 2000, now U.S. Pat. No. 6,301,190 issued on Oct. 9, 2001.

BACKGROUND OF THE INVENTION

1. Field of the Invention

The present invention relates to semiconductor memory devices and in particular to those receiving packetized commands, addresses and the like.

2. Description of the Background Art

As microprocessors operate faster, semiconductor memory devices used as main memory therefor are also required to operate more rapidly. In recent years, to achieve more rapid operation a semiconductor memory device is changing to communicate data in synchronization with a clock signal externally applied. There is also a semiconductor memory device which takes data in at both of low to high and high to low transitions of a clock signal. Furthermore, a semiconductor memory device uses a significantly rapid clock signal to internally decode and store data and addresses transmitted in the form of a packet via address and data buses reduced in bus width.

FIG. 14 is a block diagram schematically showing a configuration of a conventional semiconductor memory device 601 receiving and transmitting commands, addresses and the like in the form of a packet.

As shown in FIG. 14, semiconductor memory device 601 includes a data terminal group 602 receiving data corresponding to packetized data signals DQ0–DQ17, a clock terminal pair 604 receiving complementary clock signals Ext.clkA, /Ext.clkA externally applied, a clock terminal pair 606 receiving complementary, external clock signals Ext.clkB, /Ext.clkB, an internal terminal group 603 receiving row-related commands and addresses corresponding to packetized signals RQ5–RQ7, and an input terminal group 605 receiving column-related addresses and commands corresponding to packetized signals RQ0–RQ4.

Semiconductor memory device 601 also includes a DLL circuit 610 receiving external dock signals Ext.clkA, /Ext.clkA, Ext.clkB, /Ext.clkB and outputting internal clock signals clkA and clkB, a data input/output control circuit 624 responsive in data write operation to internal clock signal clkB for receiving packetized data from data terminal group 602 and converting the packetized data to normal data and output it and responsive in data read operation to internal clock signal clkA for internally receiving normal data and converting the normal data to packetized data and outputting it to data terminal group 602, and a DRAM core 626 operating in data write operation to store data received from data input/output control circuit 624 and operating in data read operation to output data stored therein to data input/output control circuit 624.

Semiconductor memory device 601 also includes a serial-parallel conversion circuit 618 responsive to internal clock signal clkB for receiving packetized, row-related command, address and other signals from input terminal group 603 for serial-parallel conversion, a serial-parallel conversion circuit 620 receiving packetized, column-related address command and other signals from input terminal group 605 for serial-parallel conversion, and an interface circuit 622 responsive to internal clock it signal clkB for receiving data from serial-parallel conversion circuits 618 and 620 converted to a parallel signal, and decoding the same to apply ACT, RD, WR, PRE and other command signals timed as required to DRAM core 626.

Semiconductor memory device 601 is synchronous with both of low to high and high to low transitions of a clock signal to externally transmit and receive data. When it receives a packetized instruction code the device internally deciphers the code and thereafter when a predetermined period of time elapses the device transmits read data or receives written data and internally writes the written data.

A semiconductor memory device receiving an address and the like in the form of a packet, as shown in FIG. 14, includes an interface circuit deciphering such packet data that is not mounted to conventional memories.

In a conventional semiconductor memory device, a built-in self test (BIST) is run to internally, automatically test a memory array of the device. Such an internal, automatic test, however, conventionally has not been run for testing such interface circuit.

A semiconductor memory device receiving an address and the like in the form of a packet is reduced in bus width and rapidly receives external data accordingly. As such, checking the device's operation requires a tester capable of rapid operation having an operating frequency exceeding 600 MHz. Such a high speed tester is very expensive and the cost for testing the device will thus significantly increase the cost for manufacturing the device.

SUMMARY OF THE INVENTION

The present invention contemplates a semiconductor memory device capable of operation check with a conventional tester having a low operating frequency.

Simply put, the present invention is a semiconductor memory device operating with packetized address and command signals externally received, including a test clock generation circuit, an internal packet generation circuit, a serial-parallel conversion circuit and a storage circuit.

The test clock generation circuit receives an externally applied clock signal and generates in a test mode an internal clock signal having a frequency no less than that of the clock signal. The internal packet generation circuit is responsive in the test mode to the internal clock for generating the packetized address and command signals. The serial-parallel conversion circuit in a normal mode receives the packetized address and command signals externally and in the test mode receives the packetized address and command signals from the internal packet generation circuit, the address and command signals each including a plurality of data serially input in time series, and the serial-parallel conversion circuit rearranges the plurality of data parallel to each other for output. The interface circuit receives and decodes an output from the serial-parallel conversion circuit and outputs a control signal depending on the address and command signals. The storage circuit operates to store data in response to an output from the interface circuit.

In another aspect the present invention is a semiconductor memory device including first and second internal circuits and a monitor circuit.

The second internal circuit receives an output from the first internal circuit. The monitor circuit holds an output from the first internal circuit as timed in response to an externally applied trigger signal, and externally outputs a result of holding the output from the first internal circuit thus timed.

In still another aspect the present invention is a semiconductor memory device operating with packetized address and command signals externally received, including a test clock generation circuit, a serial-parallel conversion circuit, an internal packet generation circuit, an interface circuit and a storage circuit.

The test clock generation circuit receives an externally applied clock signal and generates in a test mode an internal clock signal having a frequency no less than that of the clock signal. The serial-parallel conversion circuit in a normal mode receives the packetized address and command signals externally, the address and command signals each including a plurality of data input serially in time series, and the serial-parallel conversion circuit rearranges the plurality of data parallel to each other to provide a converted packet signal and outputting the converted packet signal. The internal packet generation circuit operates in the test mode to replace the serial-parallel conversion circuit to generate the converted packet signal in response to the internal clock. The interface circuit receives and decodes the converted packet signal and outputs a control signal depending on the address and command signals. The storage circuit operates to store data in response to an output from the interface circuit.

Advantageously, in accordance with the present invention an externally applied clock signal can be internally doubled in frequency and thus output as an internal clock signal and an internal packet generation circuit can also be provided to allow a packet signal externally, rapidly fed in normal operation to be internally generated and thus fed to a serial-parallel conversion circuit, so that the semiconductor memory device does not need to receive a rapid clock or packet signal from a tester apparatus and its operation can thus be sufficiently checked with a low speed tester.

Still advantageously, in accordance with the present invention the device can be provided with a monitor circuit, so that with a desired timing to be observed designated by a trigger signal the monitor circuit can be engaged to take in data and a signal resulting from the monitor circuit taking in the data can be externally pulled out and thus observed to allow the device's operation to be readily analyzed.

Still advantageously, in accordance with the present invention the device that does not include a plurality of parallel-serial conversion circuits can also have the interface circuit's operation checked and also the DRAM core's operation checked and such device can also be reduced in circuit scale.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
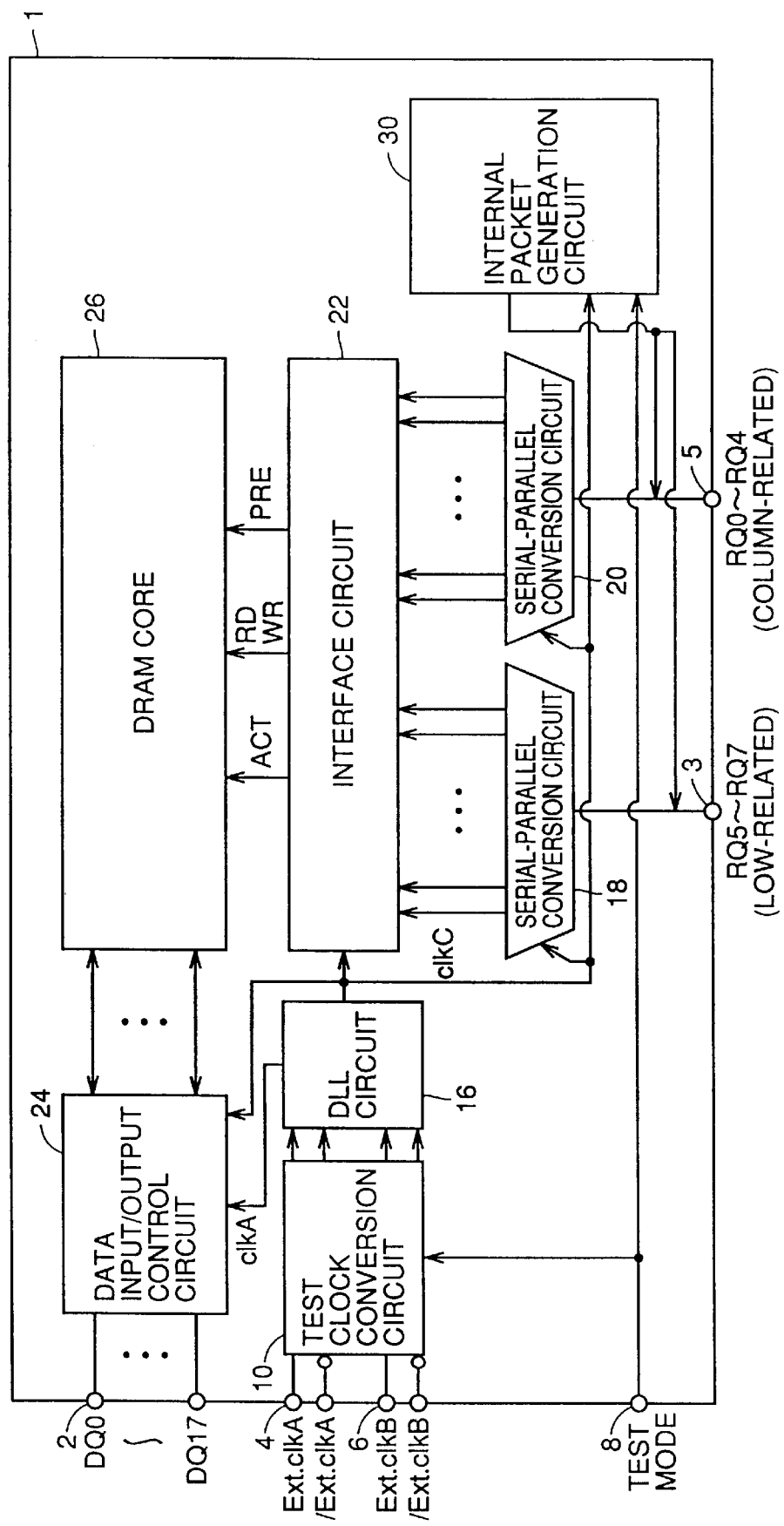
FIG. 1 is a block diagram showing a schematic configuration of a semiconductor memory device 1 according to a first embodiment of the present invention.

Hereinafter the embodiments of the present invention will be described in greater detail with reference to the drawings. In the figures, like reference characters denote like portions.

First Embodiment

FIG. 1 is a block diagram showing a schematic configuration of a semiconductor memory device 1 according to a first embodiment of the present invention.

As shown in FIG. 1, semiconductor memory device 1 includes a data terminal group 2 receiving data corresponding to packetized data signals DQ0–DQ17, a clock terminal pair 4 receiving externally applied, complementary clock signals Ext. clkA and /Ext. clkA, a clock terminal pair 6 receiving complementary, external clock signals Ext. clkB and /Ext. clkB, an input terminal group 3 receiving a row-related command and a row-related address corresponding to packetized signals RQ5–RQ7, and an input terminal group 5 receiving a column-related address signal and a column-related command corresponding to packetized signals RQ0–RQ4.

Semiconductor memory device 1 also includes a test clock conversion circuit 10 receiving external clock signals Ext. clkA and /Ext. clkA and Ext. clkB and /Ext. clkB and halving their respective periods in a test mode for output, a DLL circuit 16 receiving an output from test clock conversion circuit 10 and outputting internal clock signals clkA and clkC, an input/output control circuit 24 responsive in data write operation to internal clock signal clkC for converting packetized data received from data terminal group 2 into normal data and internally outputting the normal data and responsive in data read operation to internal clock signal clkA for converting internally received normal data into packetized data and outputting the packetized data to data terminal group 2, and a DRAM core 26 operating in data read operation to store data received from data input/output control circuit 24 and in data read operation to output its stored data to data input/output control circuit 24.

Semiconductor memory device 1 also includes a serial-parallel conversion circuit 18 responsive to internal clock signal clkC for receiving a packetized, row-related command and a packetized, row-related address signal input via input terminal group 3 for serial-parallel conversion, a serial-parallel conversion circuit 20 responsive to internal clock signal clkC for receiving a packetized, column-related address signal and a packetized, column-related command for serial-parallel conversion, and an interface circuit 22 responsive to internal clock signal clkC for receiving from serial-parallel conversion circuits 18 and 20 the data converted into parallel signals, decoding the data and applying command signals such as ACT, RD, WR, PRE and the like to DRAM core 26 at a timing as required.

Semiconductor memory device 1 is synchronized with both of rising and falling edges of a clock signal to communicate data externally. When it receives a packetized instruction code, it internally decrypts the code and thereafter when a predetermined period of time elapses it transmits read data or receives written data and internally writes the data.

Semiconductor memory device 1 also includes an internal packet generation circuit 30 operating in response to clock signal clkC doubled in frequency when a test mode is externally directed, and, in testing the device, internally generating packetized data and feeding to serial-parallel conversion circuits 18 and 20 the packetized data rather than receiving data from external input terminal groups 3 and 5.

Figure 2:
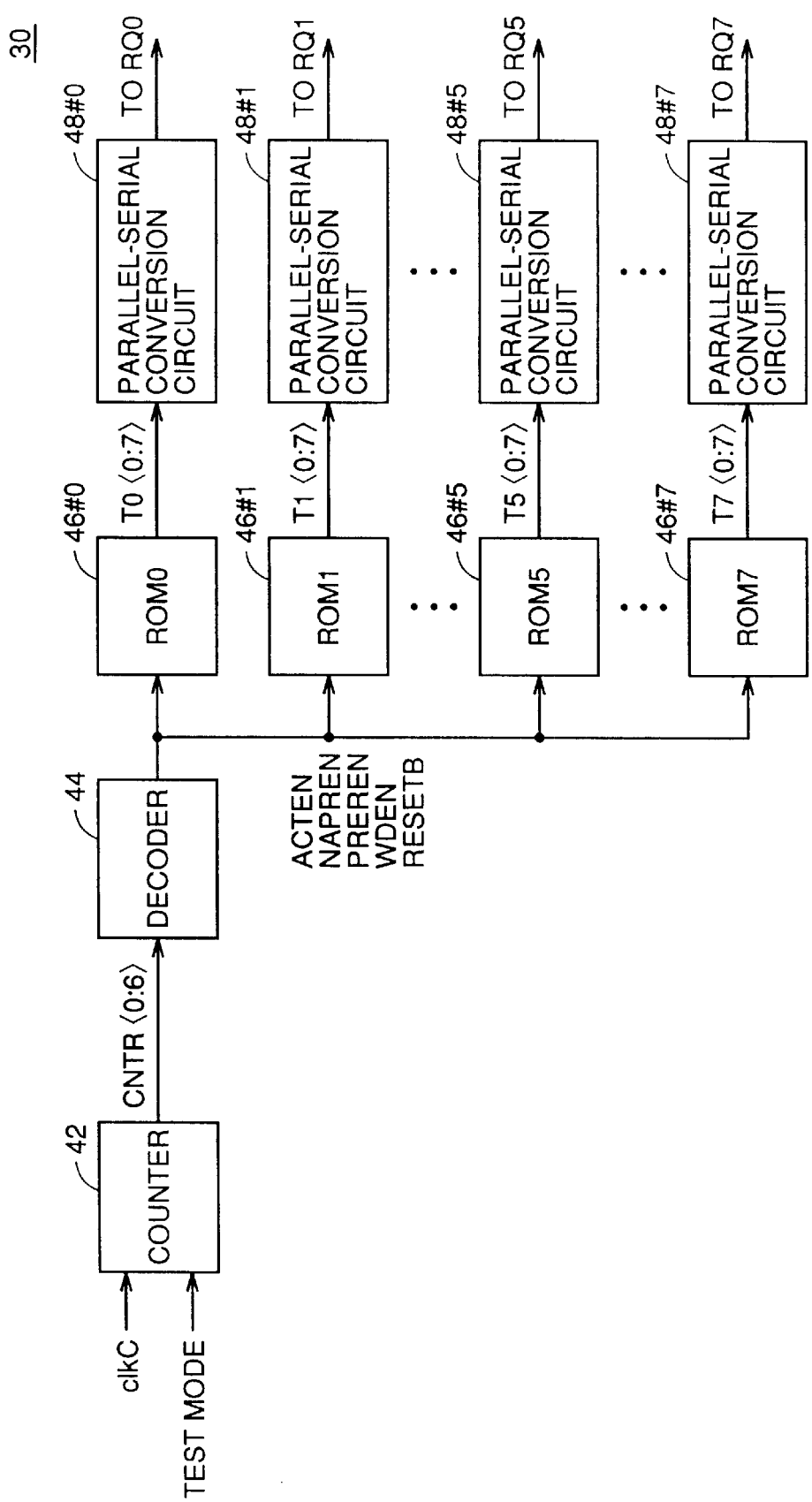
FIG. 2 is a block diagram showing a configuration of an internal packet generation circuit 30 shown in FIG. 1.

FIG. 2 is a block diagram showing a configuration of internal packet generation circuit 30 shown in FIG. 1.

As shown in FIG. 2, internal packet generation circuit 30 includes a counter starting a count operation in response to clock signal clkC in the test mode when a signal TESTMODE is activated, a decoder 44 receiving a count signal CNTR<0> to CNTR<6> from counter 42 and decoding the signal and outputting internal command signals ACTEN, NAPREN, PREREN, WDEN and RESETB, ROMs 46#0 to 46#7 receiving an output from decoder 44 and each outputting an input pattern corresponding to its input terminal as parallel signals T0–T7, and parallel-serial conversion circuits 48#0–48#7 receiving respective outputs from ROM 46#0–46#7 for parallel-serial conversion. Parallel-serial conversion circuits 48#0–48#7 output test patterns replacing input signals RQ0–RQ7 input via their respective terminals.

Figure 3:
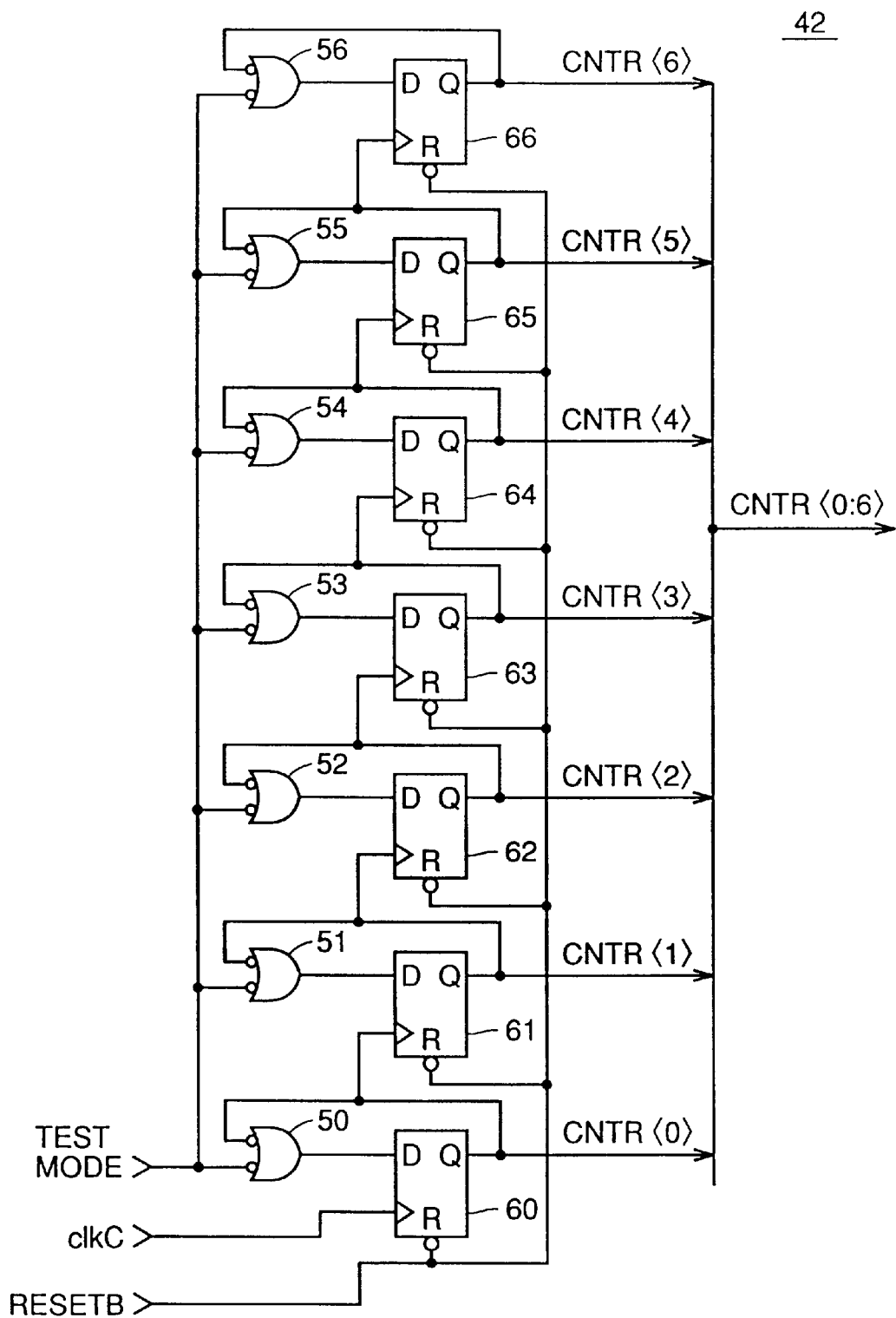
FIG. 3 is a circuit diagram showing a configuration of a counter 42 shown in FIG. 2.

FIG. 3 is a circuit diagram showing a configuration of counter 42 shown in FIG. 2.

As shown in FIG. 3, counter 42 includes NAND circuits 50–56 each having one input receiving signal TESTMODE, and D flip flops 60–66 reset when a reset signal RESETB is logical low.

D flip flop 60 receives clock signal clkC as a clock input and an output from NAND circuit 56 as a D input and outputs signal CNTR<0> as a Q output. Signal CNTR<0> is fed to the other input of an NAND circuit and a clock input of D flip flop 61.

D flip flop 61 receives an output from NAND circuit 51 as a D input and outputs signal CNTR<1> as a Q output. Signal CNTR<1> is fed to the other input of NAND circuit 51 and a clock input of D flip flop 62.

D flip flop 62 receives an output from NAND circuit 52 as a D input and outputs signal CNTR<2> as a Q output. Signal CNTR<2> is fed to the other input of NAND circuit 52 and a clock input of D flip flop 63.

D flip flop 63 receives at a D input an output from NAND circuit 53 and outputs signal CNTR<3> via a Q output. Signal CNTR<3> is fed to the other input of NAND circuit 53 and a clock input of D flip flop 64.

D flip flop 64 receives at a D input an output from NAND circuit 54 and outputs signal CNTR<4> via a Q output. Signal CNTR<4> is fed to the other input of NAND circuit 54 and a clock input of D flip flop 65.

D flip flop 65 receives at a D input an output from NAND circuit 55 and outputs signal CNTR<5> via a Q output. Signal CNTR<5> is fed to the other input of NAND circuit 55 and a clock input of D flip flop 66.

D flip flop 66 receives at a D input an output from NAND circuit 56 and outputs signal CNTR<6> via a Q output. Signal CNTR<6> is fed to the other input of NAND circuit 56.

In other words, counter 42 operates as a 7bit counter reset by reset signal RESETB, and counting clock signal clkC when signal TESTMODE goes high.

Figure 4:
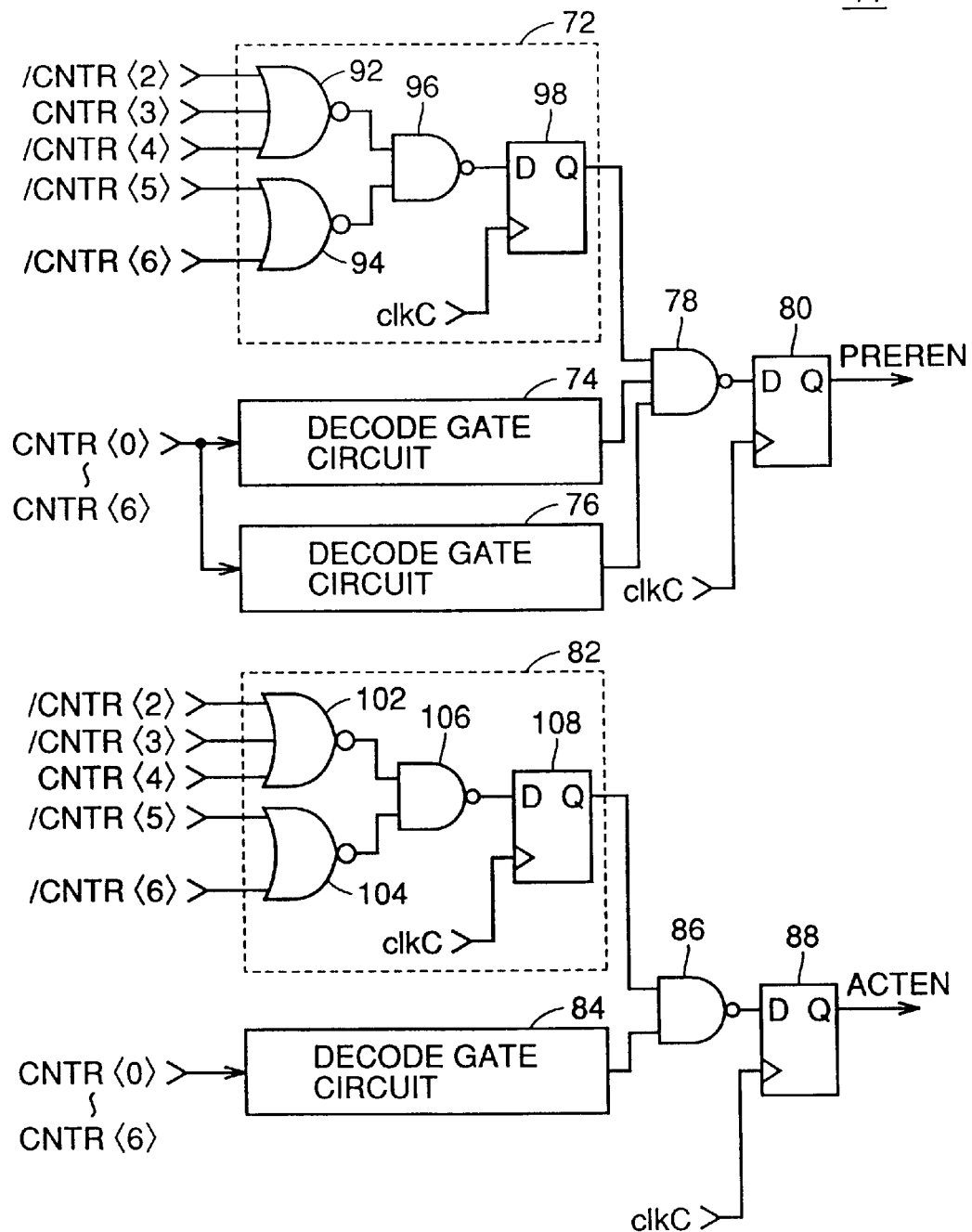
FIG. 4 is a circuit diagram schematically showing a portion of a configuration of a decoder 44 shown in FIG. 2.

FIG. 4 is a circuit diagram schematically showing a portion of a configuration of decoder 44 shown in FIG. 2.

As shown in FIG. 4, decoder 44 includes decode gate circuits 72–76 receiving an output from counter 42, an NAND circuit 78 receiving outputs from decode gate circuits 72–76, and a D flip flop 80 responsive to clock signal clkC for taking in an output from NAND circuit 78 and outputting internal command signal PREREN.

Decoder 44 also includes decode gate circuits 82 and 84 receiving an output from counter 42, an NAND circuit 86 receiving outputs from decode gate circuits 82 and 84, and a D flip flop 88 responsive to clock signal clkC for taking in an output from NAND circuit 86 and outputting internal command signal ACTEN.

Decode gate circuit 72 includes an NOR circuit 92 receiving signals /CNTR<2>, CNTR<3> and /CNTR<4> output from counter 42, an NOR circuit 94 receiving signals /CNTR<5> and /CNTR<6>, an NAND circuit 96 receiving outputs from NOR circuits 92 and 94, and a D flip flop 98 responsive to clock signal clkC for taking in an output from NAND circuit 96 and outputting it to NAND circuit 78.

Decode gate circuit 82 includes an NOR circuit 102 receiving signals /CNTR<2>, /CNTR<3> and CNTR<4>, an NOR circuit 104 receiving signals /CNTR<5> and /CNTR<6>, an NAND circuit 106 receiving outputs from NOR circuits 102 and 104, and a D flip flop 108 responsive to clock signal clkC for taking in an output from NAND circuit 106 and outputting it to NAND circuit 86.

In other words, the decode circuit includes a plurality of decode gate circuits which detect whether a count value output from counter 42 matches a predetermined count value and if so each decode gate circuit activates an output at a desired timing at which their respectively associated, internal command signals PREREN, ACTEN and the like are output. Combining the decode gate circuits each with an output activated at a different timing allows various test patterns to be generated.

Figure 5:
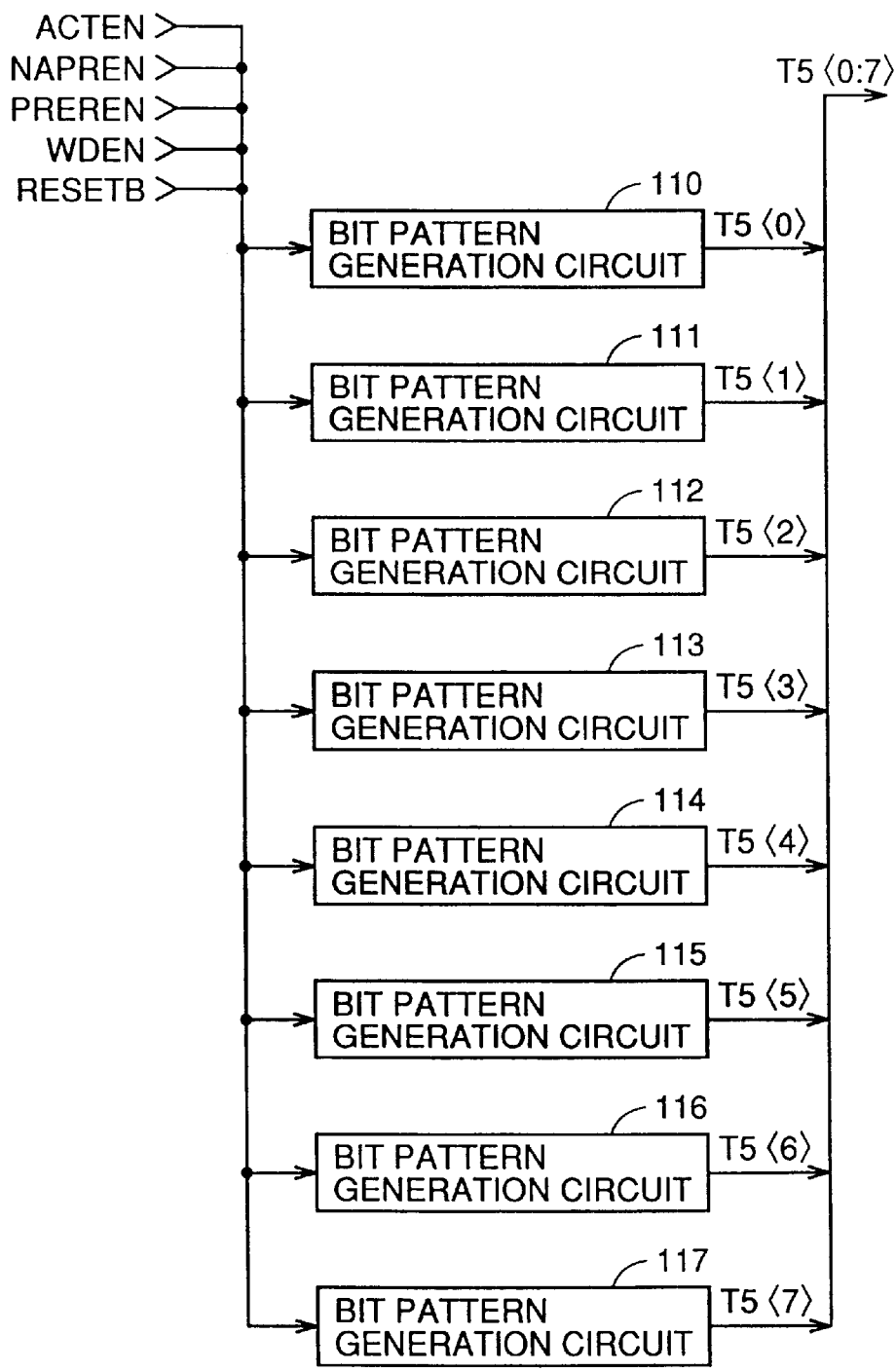
FIG. 5 is a block diagram showing a configuration of a ROM 46#5 shown in FIG. 2.

FIG. 5 is a block diagram showing a configuration of ROM 46#5 shown in FIG. 2.

As shown in FIG. 5, ROM 46#5 includes bit pattern generation circuits 110–117 receiving internal command signals ACTEN, NAPREN, PREREN, WDEN and RESETB and outputting signals T5<0>–T5<7>, respectively.

Figure 6:
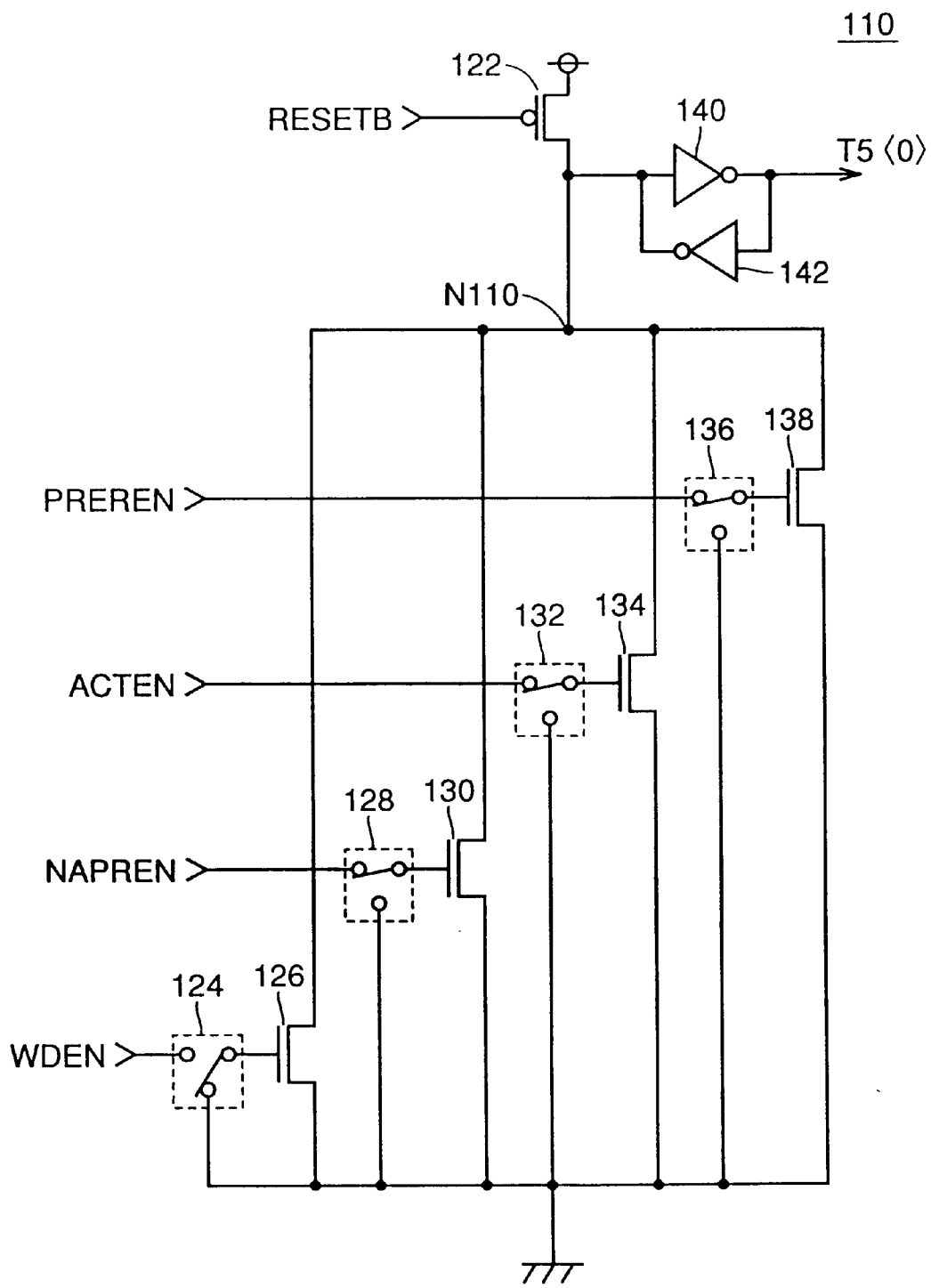
FIG. 6 is a circuit diagram showing a configuration of a bit pattern generation circuit 110 shown in FIG. 5.

FIG. 6 is a circuit diagram showing a configuration of bit pattern generation circuit 110 shown in FIG. 5.

As shown in FIG. 6, bit pattern generation circuit 110 includes a p channel MOS transistor 122 connected between a power supply node and a node N110 and having a gate receiving internal command signal RESETB, a select circuit 124 selectively outputting internal command signal WDEN or a low level (ground potential) signal, an n channel MOS transistor 126 connected between node N110 and a ground node and having a gate receiving an output from select circuit 124, a select circuit 128 selectively outputting either one of internal command signal NAPREN and the ground potential, an n channel MOS transistor 130 connected between node N110 and the ground node and having a gate receiving an output from select circuit 128, a select circuit 132 selectively outputting either one of internal command signal ACTEN and the ground potential, an n channel MOS transistor 134 connected between node N1 10 and the ground node and having a gate receiving an output from select circuit 132, a select circuit 136 selectively outputting either one of internal command signal PREREN and the ground potential, and an n channel MOS transistor 138 connected between node N110 and the ground node and having a gate receiving an output from select circuit 136.

Bit pattern generation circuit 110 also includes an inverter 140 having an input connected to node N110 and outputting signal T5<0>, and an inverter 142 receiving and inverting an output from inverter 140 and outputting it to node N110.

Herein, select circuit 124 selects the ground node and thus feeds the ground potential to the gate of n channel MOS transistor 126. Select circuit 128 selects and feeds internal command signal NAPREN to the gate of n channel MOS transistor 130. Select circuit 132 selects and feeds internal command signal ACTEN to the gate of n channel MOS transistor 134. Select circuit 136 selects and feeds internal command signal PREREN to the gate of n channel MOS transistor 138.

Thus, when bit pattern generation circuit 110 receives internal command signals PREREN, ACTEN, NAPREN, node N110 is driven low and signal T5<0> responsively goes high.

The select circuits 124, 128, 132 and 136 connection shown in the figure can be switched for example by changing the position of a metal wiling layer and that of a contact window. For example, the mask for the metal wiring layer and that for the contact window that may be changed and thus prepared to change a bit pattern.

ROMs 46#0, 46#1, 46#7 shown in FIG. 2 each also include a plurality of bit pattern generation circuits with such select circuits having an internal connection changed as appropriate.

Figure 7:
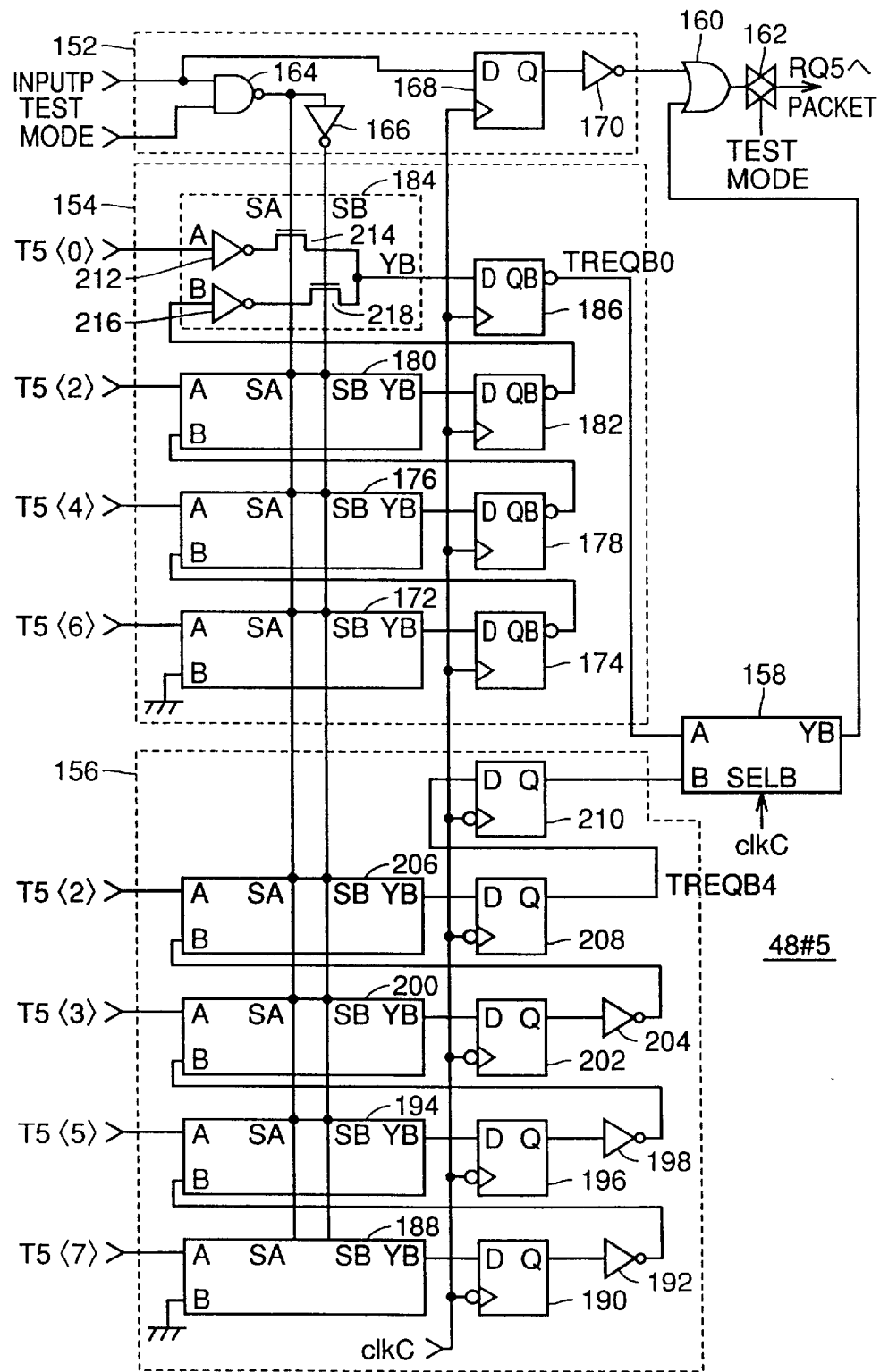
FIG. 7 is a circuit diagram showing a configuration of a parallel-serial conversion circuit 48#5 shown in FIG. 2.

FIG. 7 is a circuit diagram showing a configuration of parallel-serial conversion circuit 48#5 shown in FIG. 2.

As shown in FIG. 7, parallel-serial conversion circuit 48#5 includes a timing provision circuit 152 responsive to signals INPUTP and TESTMODE for providing various timings, a conversion circuit 154 responsive to an output from timing provision circuit 152 for receiving signals T5<0>, T5<2>, T5<4>, T5<6> for parallel-serial conversion, and a conversion circuit 156 receiving signals T5<2>, T5<3>, T5<5>, T5<7> for parallel-serial conversion in response to an output from timing provision circuit 152.

Parallel-serial conversion circuit 48#5 also includes a selector 158 responsive to clock signal clkC for alternately outputting outputs from conversion circuits 154 and 156, an OR circuit 160 transmitting an output from selector 158 at a timing provided by timing provision circuit 152, and a transmission gate 162 conducting in response to logical high signal TESTMODE to couple a path for passing a signal from a terminal externally receiving signal RQ5 to the FIG. 1 serial-parallel conversion circuit 18 and an output of OR circuit 160 together.

Timing provision circuit 152 includes an NAND circuit 164 receiving signals INPUTP and TESTMODE and outputting a signal SA, an inverter 166 receiving and inverting signal SA and outputting a signal SB, a D flip flop 168 responsive to clock signal clkC for taking in signal INPUTP, and an inverter 170 receiving and inverting a Q output from D flip flop 168 and outputting it to OR circuit 160.

Conversion circuit 154 includes a selector 172 having an A input receiving signal T5<6> and a B input receiving a ground potential, a D flip flop 174 responsive to clock signal clkC for taking in an output from selector 172, a selector 176 having a B input receiving a QB output from D flip flop 174 and having an A input receiving signal T5<4>, a D flip flop 178 responsive to clock signal clkC for taking in an output from selector 176, a selector 180 having a B input receiving a QB output from D flip flop 178 and having an A input receiving signal T5<2>, a D flip flop 182 responsive to clock signal clkC for taking in an output from selector 180, a selector 184 having a B input receiving a QB output from D flip flop 182 and having an A input receiving signal T5<0>, and a D flip flop 186 taking in an output from selector 184 in response to clock signal clkC and outputting a signal TREQB0 via a QB output.

Selector 184 includes an inverter 212 receiving and inverting an A input, an n channel MOS transistor 214 activated in response to signal SA to transmit an inverter 212 output to an output YB, an inverter 216 receiving and inverting a B input, and an n channel MOS transistor 218 activated in response to signal SB to transmit an inverter 216 output to output YB. Selectors 172, 176, 180 are also similarly configured as above and will thus not be described in detail.

D flip flops 174, 178, 182, 186 receive data at a D input, inverts the data in polarity and outputs the inverted data via a QB output.

Conversion circuit 156 includes a selector 188 having a B input receiving a ground potential and having an A input receiving signal T5<7>, a D flip flop 190 responsive to clock signal clkC for taking in an output from selector 188, an inverter 192 receiving and inverting a Q output from D flip flop 190, a selector 194 having a B input receiving an output from inverter 192 and having an A input receiving signal T5<5>, a D flip flop 196 responsive to clock signal clkC for taking in an output from selector 194, and an inverter 198 receiving and inverting a Q output from D flip flop 196.

Conversion circuit 156 also includes a selector 200 having a B input receiving an output from inverter 198 and an A input receiving signal T5<3>, a D flip flop 202 responsive to clock signal clkC for taking in an output from selector 200, an inverter 204 receiving and inverting a Q output from D flip flop 202, a selector 206 having a B input receiving an output from inverter 204 and having an A input receiving signal T5<2>, a D flip flop 208 responsive to clock signal clkC for taking in an output from selector 206, and a D flip flop 210 responsive to clock signal clkC for taking in a Q output from D flip flop 208.

Selectors 188, 194, 200, 206 are also similarly configured and will thus not be described in detail.

D flip flops 190, 196, 202, 208, 210 take in data in response to a falling edge of clock signal clkC. D flip flop 210 provides a Q output fed to selector 158 at a B input, and D flip flop 186 provides a QB output fed to selector 158 at an A input.

As such, conversion circuits 154 and 156 allow parallel-serial conversion of data to be output as odd-numbered data and data to be output as even-numbered data, respectively. This allows the data to be rapidly converted.

Figure 8:
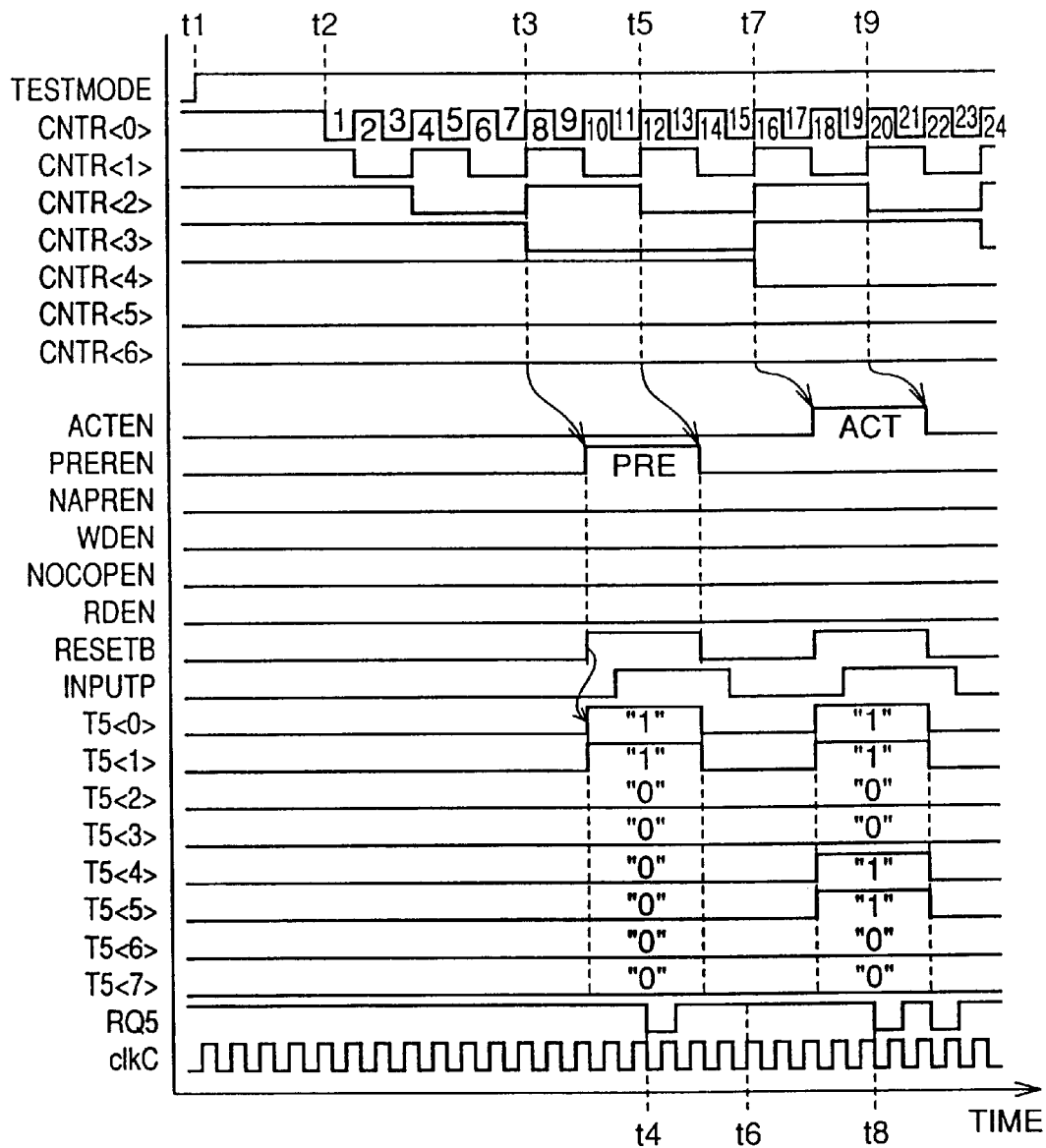
FIG. 8 is a waveform diagram for illustrating an operation of an internal packet generation circuit 30 shown in FIG. 2.

FIG. 8 is a waveform diagram for illustrating an operation of internal packet generation circuit 30 shown in FIG. 2.

As represented in FIG. 8, at time t1, signal TESTMODE goes high and a test mode is thus designated. Responsively, from time t2 the FIG. 3 counter 42 start a count operation. At time t3 the counter's value matches a value set in the FIG. 4 decode gate circuit 72. Responsively, from time t3 through time t5, NAND circuit 96 outputs a low level signal. After the D flip flops 98 and 80 respective delay time periods elapse, internal command signal PREREN is activated.

In response to the activation of internal command signal PREREN, the FIG. 5 bit pattern generation circuits 110–117 output signals T5<0>T5<7>, which are 11000000 in serial order. When such signals are input to the FIG. 7 parallel-serial conversion circuit 48#5 the signals are converted to serial signals and output as signal RQ5, one of packetized input signals, in synchronization with falling and rising edges of clock signal clkC. More specifically, an inverted version of the pattern of the signals T5<0>–T5<7>, 00111111, are successively output from time t4 at a high to low transition of clock signal clkC through time t6 at a low to high transition thereof.

Similarly, from time t7 through time t9 the FIG. 4 decode gate circuit 82 detects the counter's value and activates internal command signal ACTEN. Responsively, the bit pattern generation circuit generates a bit pattern which is in tern converted by parallel-serial conversion circuit 48#5 to serial signals and from time t8 onwards a bit pattern of 00110011 are successively output.

As such, in the first embodiment a semiconductor memory device allows an externally applied clock signal to be internally doubled in frequency and thus output as an internal clock signal and it may also be provided with an internal packet generation circuit internally generating a packet signal which in a normal operation is externally, rapidly fed, and feeding the internally generated packet signal to a serial-parallel conversion circuit. As such the semiconductor memory device does not need to receive a rapid clock or packet signal from a tester apparatus and its operation can thus be sufficiently checked with a low speed tester.

Second Embodiment

Figure 9:
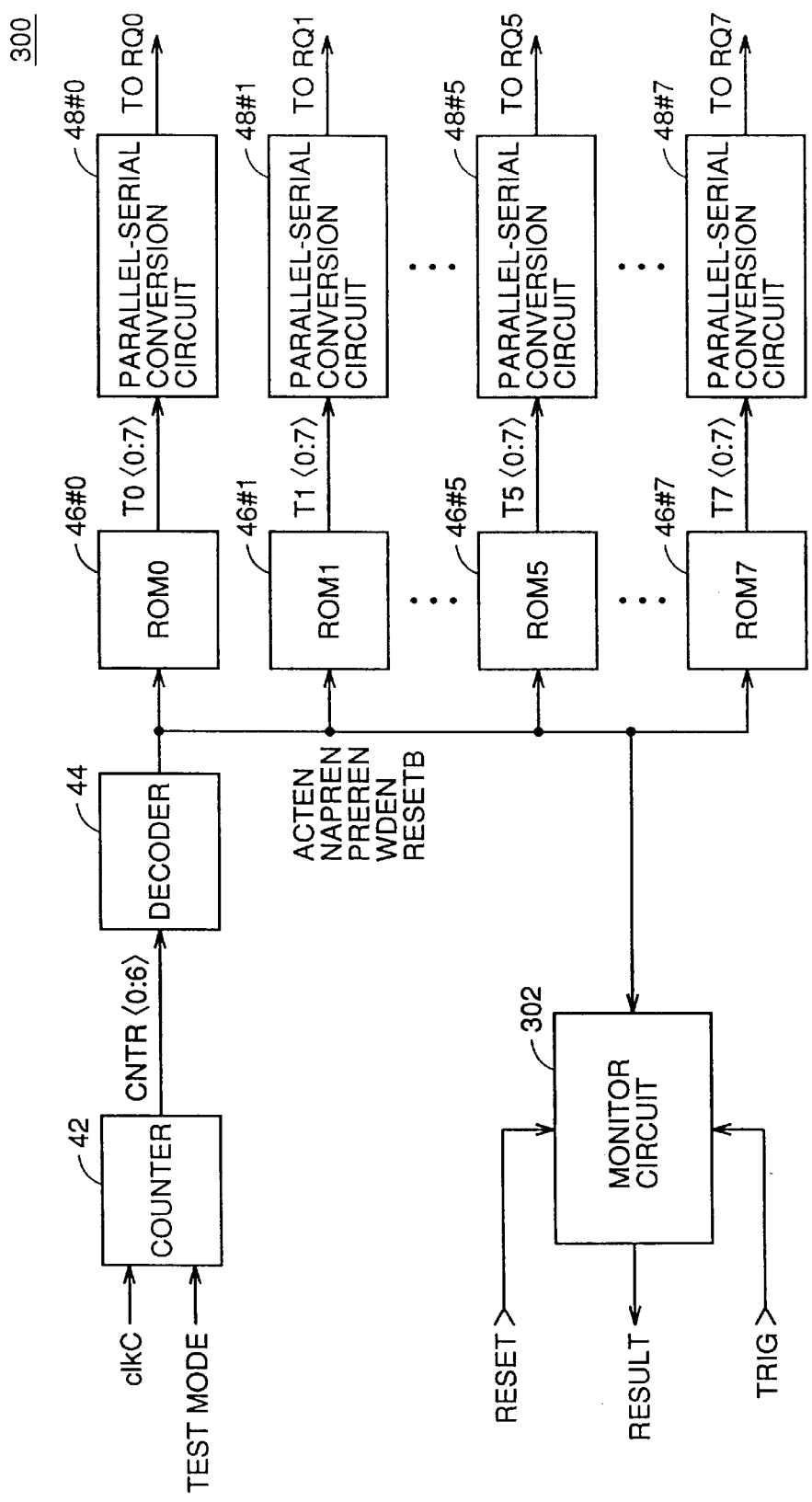
FIG. 9 is a block diagram showing a configuration of an internal packet generation circuit 300 used in a second embodiment of the present invention.

FIG. 9 is a block diagram showing a configuration of an internal packet generation circuit 300 used in a second embodiment of the present invention.

As shown in FIG. 9, internal packet generation circuit 300 is generally similar in configuration to the FIG. 2 internal packet generation circuit 30, except that it further includes a monitor circuit 302 which is reset by a reset signal RESET and is responsive to a signal TRIG for monitoring an internal command signal's state to output a result of monitoring the signal's state as a signal RESULT.

Figure 10:
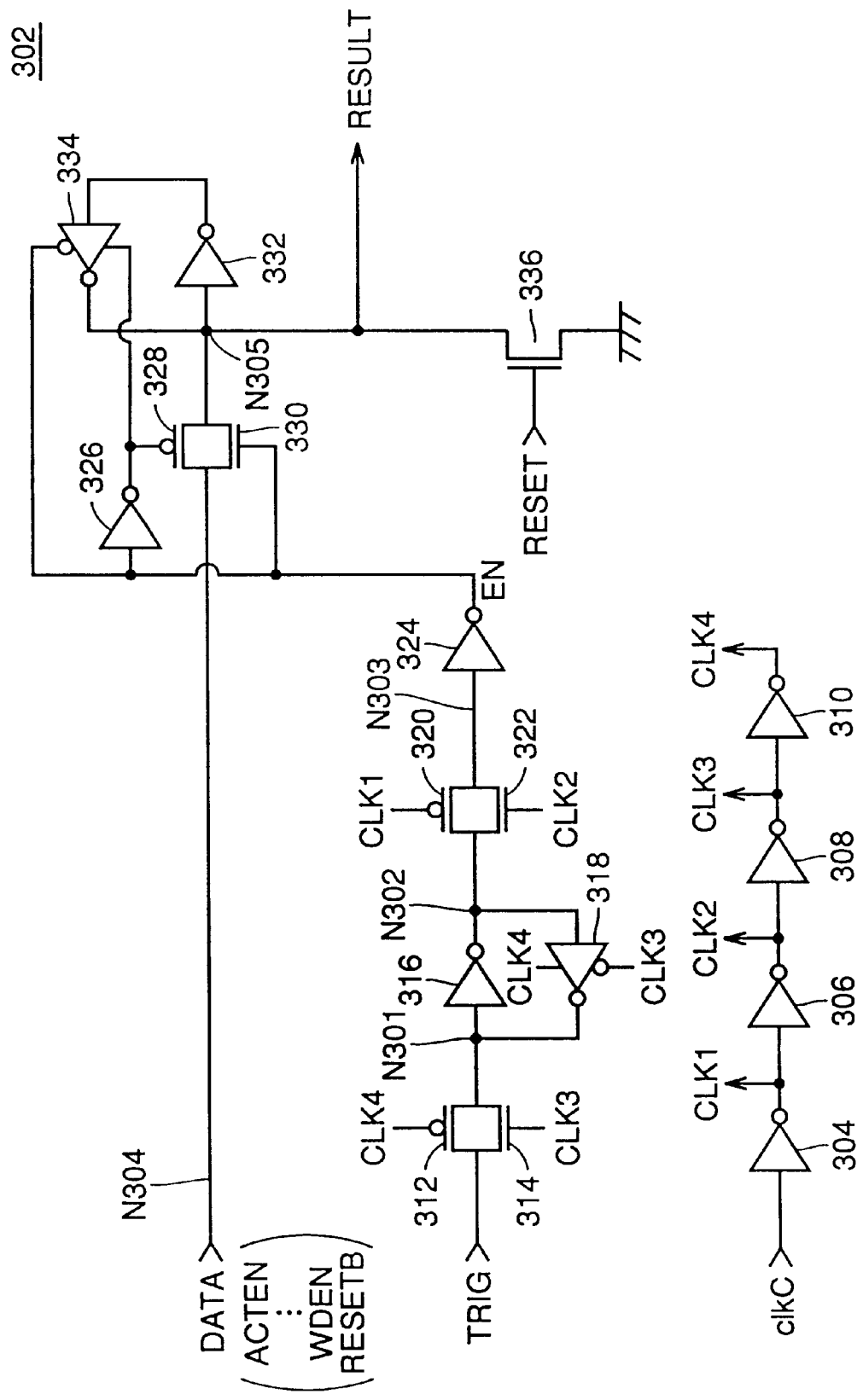
FIG. 10 is a circuit diagram showing a configuration of a monitor circuit 302 shown in FIG. 9.

FIG. 10 is a circuit diagram showing a configuration of monitor circuit 302 shown in FIG. 9.

As shown in FIG. 10, monitor circuit 302 includes an inverter 304 receiving and inverting clock signal clkC and outputting a clock signal CLK1, an inverter 306 receiving and inverting clock signal CLK1 and outputting a clock signal CLK2, an inverter 308 receiving and inverting clock signal CLK2 and outputting a clock signal CLK3, and an inverter 310 receiving and inverting clock signal CLK3 and outputting a clock signal CLK4.

Monitor circuit 302 also includes a p channel MOS transistor 312 having a gate receiving clock signal CLK4 and transmitting signal TRIG to a node N301, an n channel MOS transistor 314 responsive to clock signal CLK3 for transmitting signal TRIG to node N301, an inverter 316 having an input connected to node N301 and having an output connected to a node N302, a clocked inverter 318 responsive to clock signals CLK4 and CLK3 for inverting an output from inverter 316 and outputting it to node N301, p and n channel MOS transistors 320 and 322 connected between nodes N302 and 303 and receiving clock signals CLK1 and CLK2, respectively, an inverter 324 having an input connected to node N303 and outputting a signal EN, and an inverter 326 receiving and inverting signal EN.

Monitor circuit 302 also includes p and n channel MOS transistors 328 and 330 having their respective gates receiving an output from inverter 326 and signal EN, respectively, and receiving a data signal DATA from an node N304 and transmitting data signal DATA to a node N305, an inverter 332 having an input connected to node N305, a clocked inverter 334 activated in response to the output from inverter 326 and signal EN to invert an output from inverter 332 and output it to node N305, and an n channel MOS transistor 336 responsive to reset signal RESET for connecting node N305 to a ground node.

From node N305 is output signal RESULT corresponding to a result of monitoring data signal DATA at a timing designated by signal TRIG.

Data signal DATA fed is for example internal command signals ACTEN, WDEN, RESETB output from decoder 44.

Figure 11:
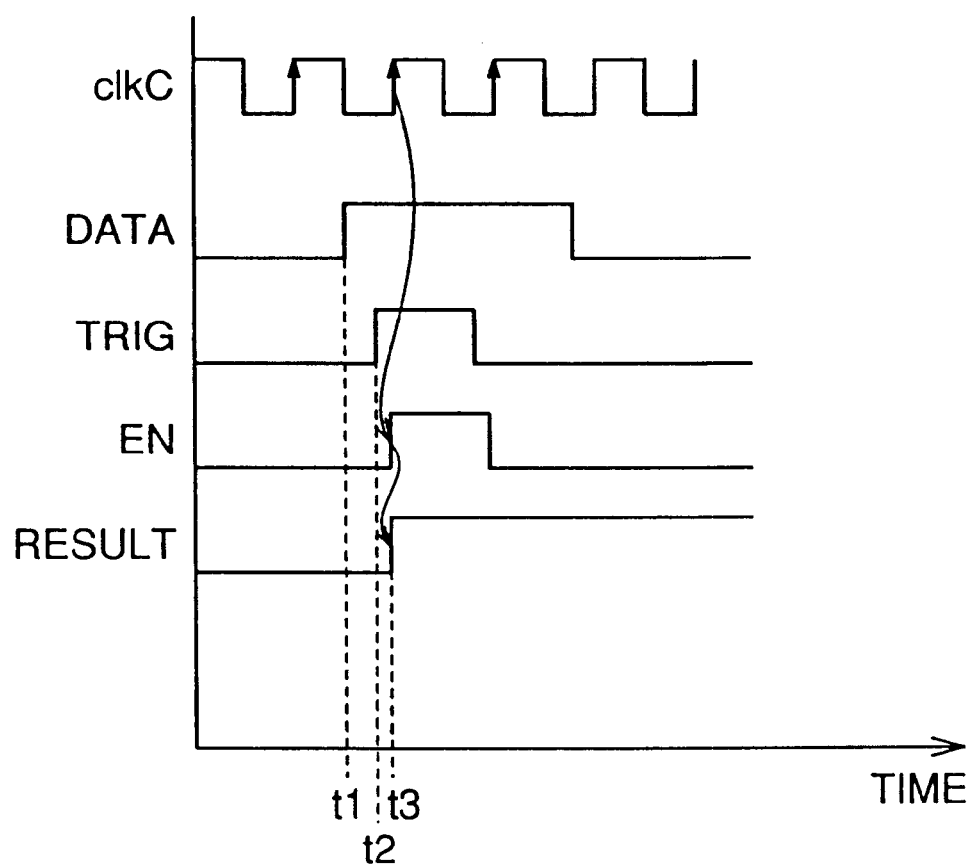
FIG. 11 is a waveform diagram for illustrating an operation of a monitor circuit 302 shown in FIG. 10.

FIG. 11 is a waveform diagram for illustrating an operation of monitor circuit 302 shown in FIG. 10.

With reference to FIGS. 10 and 11, at time t1 data signal DATA goes high and thereafter at time t2 signal TRIG goes high. Then, at time t3, signal EN is activated in synchronization with a rising edge of clock signal clkC. As such, signal DATA can be taken in to a latch configured of inverter 332 and clocked inverter 334, held as signal RESULT, and thus observable as a test result.

Conventionally, if a main signal's behavior is required to be analyzed the semiconductor memory device's chip is preliminary processed and a signal line thereof is needled to observe and analyze a waveform via an oscilloscope or the like. In contrast, the semiconductor device of the present invention having a monitor circuit allows the monitor circuit to take data thereinto with signal TRIG designating a desired timing to be observed, so that a resultant signal can be externally extracted and thus observed. In other words, in a vicinity of a main signal required to have its behavior previously analyzed the monitor circuit can be provided and thus monitor the main signal to readily analyze the signal's behavior.

Third Embodiment

Figure 12:
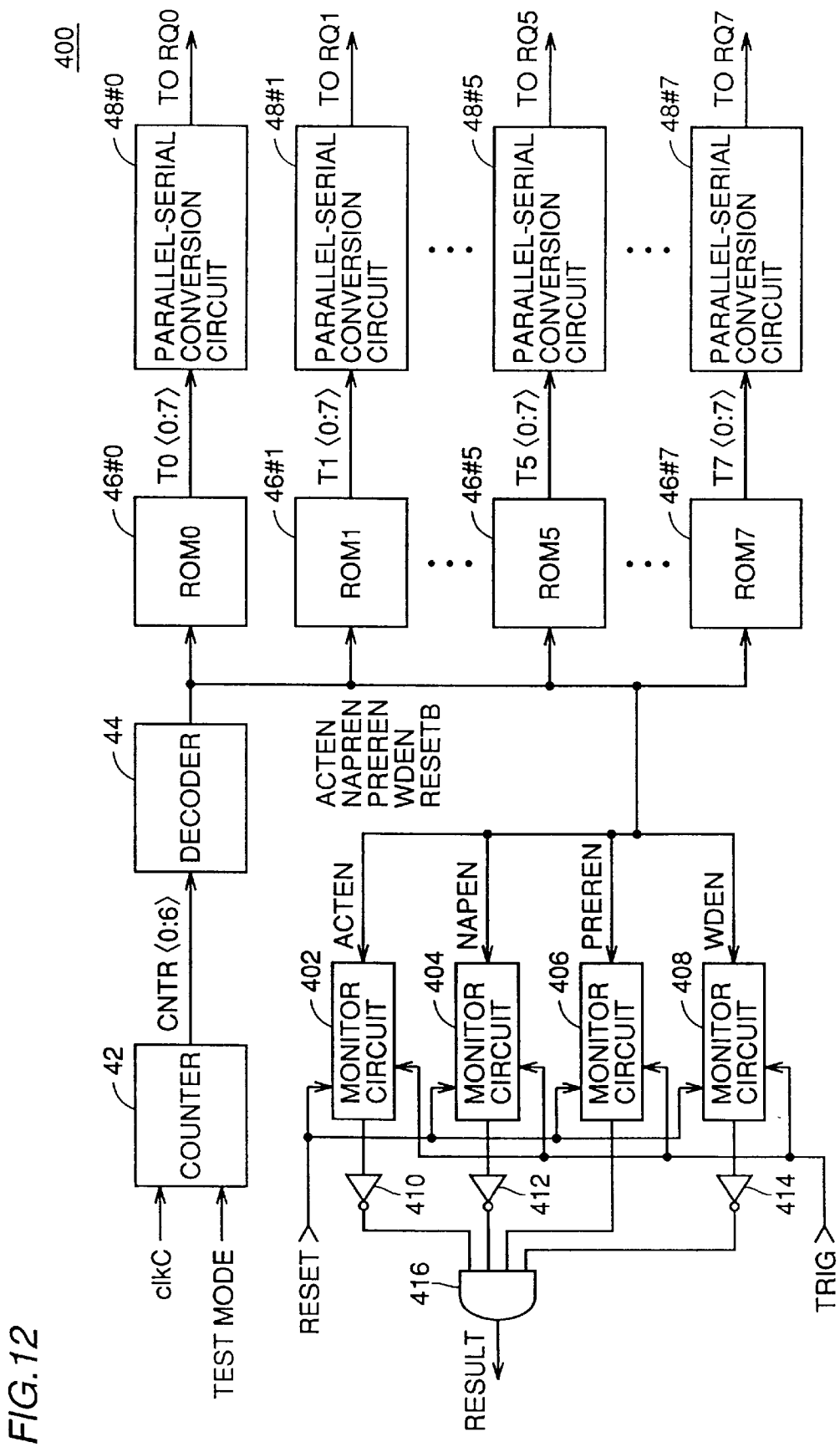
FIG. 12 is a block diagram showing a configuration of an internal packet generation circuit 400 used in a third embodiment of the present invention.

FIG. 12 is a block diagram showing a configuration of an internal packet generation circuit 400 according to a third embodiment of the present invention.

As shown in FIG. 12, internal packet generation circuit 400 in the third embodiment is generally similar in configuration to the FIG. 9 internal packet generation circuit 300, except that the former replaces monitor circuit 302 with monitor circuits 402, 404, 406 and 408 and the former further includes an inverter 410 receiving and inverting an output from monitor circuit 402, an inverter 412 receiving and inverting an output from monitor circuit 404, an inverter 414 receiving and inverting an output from monitor circuit 408, and an AND circuit 416 receiving outputs respectively from inverters 410, 412 and 414 and monitor circuit 406 and outputting signal RESULT.

Monitor circuit 402 is reset by reset signal RESET and monitors internal command signal ACTEN at a timing designated by signal TRIG. Monitor circuit 404 is reset in response to reset signal RESET and monitors internal command signal NAPREN at a timing designated by signal TRIG. Monitor circuit 406 is reset in response to reset signal RESET and monitors internal command signal PREREN at a timing designated by signal TRIG. Monitor circuit 408 is reset in response to reset signal RESET and monitors internal command signal WDEN at a timing designated by signal TRIG.

For example, if to determine whether count signals CNTR<0>–CNTR<6> generated by counter 42 from time t3 through time t5 have been decoded accurately the signal TRIG is activated at a corresponding timing, internal command signals ACTEN, NAPREN, WDEN are expected to be logical low and signal PREREN is expected to be logical high.

Inverters 410, 412, 414 are provided to correspond to such expected values, and AND circuit 416 is provided to degenerate the values. As such, if AND circuit 416 outputs a high level signal then a decision can be made that decoder 44 operates properly.

It should be noted that monitor circuits 402 to 408 are similar in configuration to the FIG. 10 monitor circuit 302 and will thus not be described in detail.

Since a plurality of monitor circuits are provided and an inverter is provided to correspond to an expected value and an AND circuit is provided to degenerate the value, simply checking a single signal allows a decision that internally generated, multiple internal signals each have an appropriate state.

Fourth Embodiment

Figure 13:
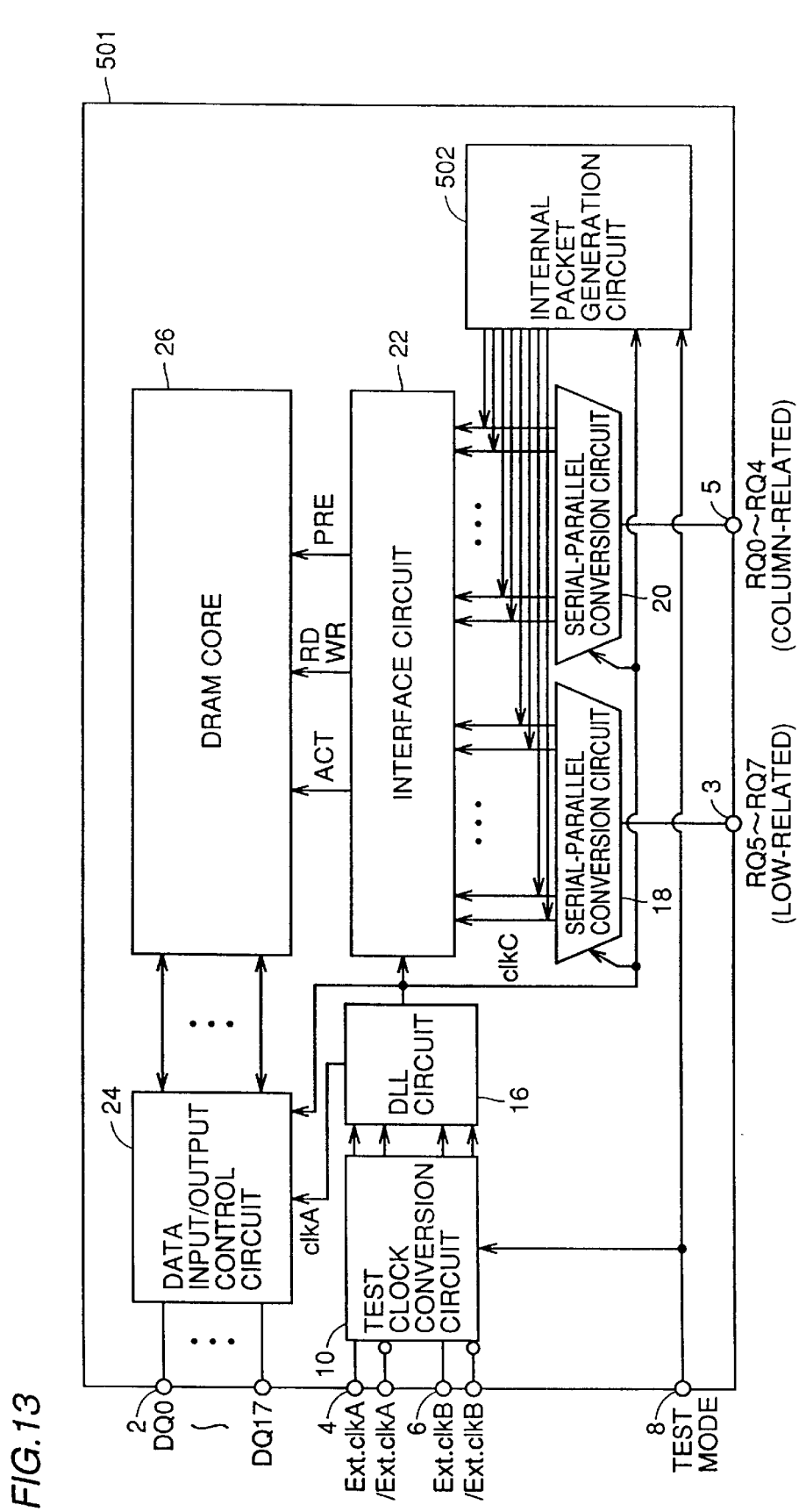
FIG. 13 is a block diagram showing a schematic configuration of a semiconductor memory device 501 according to a fourth embodiment of the present invention.
Figure 14:
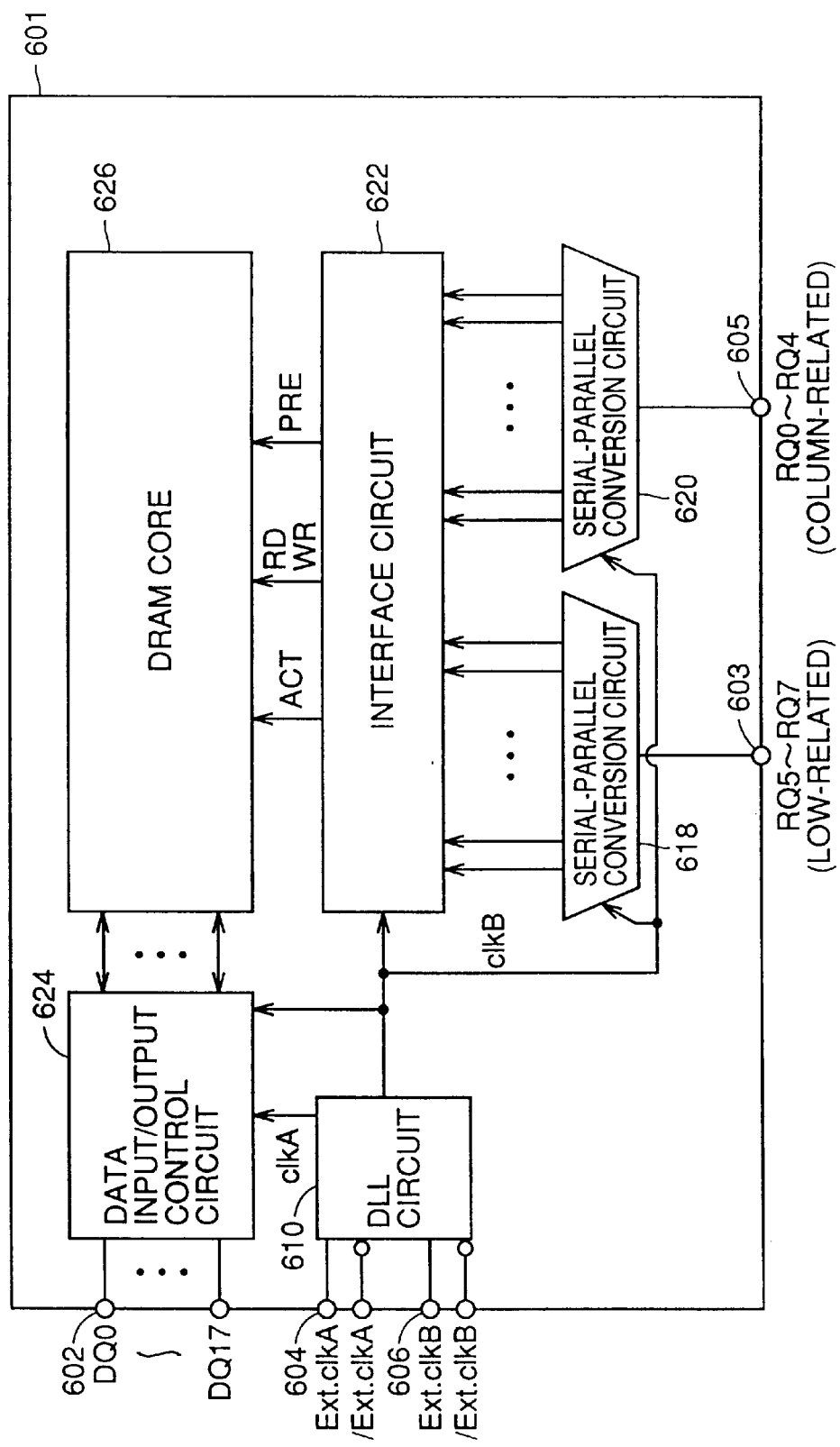
FIG. 14 is a block diagram schematically showing a configuration of a conventional semiconductor memory device 601 transmitting and receiving commands, addresses and the like in packets.

FIG. 13 is a block diagram showing a general configuration of a semiconductor memory device 501 according to a fourth embodiment of the present invention.

As shown in FIG. 13, semiconductor memory device 501 is generally similar in configuration to the FIG. 1 semiconductor memory device 1, except that semiconductor memory device 501 replaces internal packet generation circuit 30 with an internal packet generation circuit 502.

Internal packet generation circuit 502 has the FIG. 2 internal packet generation circuit 30 configuration minus parallel-serial conversion circuits 48#0–48#7, and it thus feeds signals T0–T7 directly to interface circuit 22 without parallel-serial conversion.

As such, without internal packet generation circuit 500 having multiple parallel-serial conversion circuits the interface circuit 22 operation can still be checked and so can the DRAM core 26 operation.

That is, the circuit's scale can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a first internal circuit;

a second internal circuit receiving an output from said first internal circuit; and a monitor circuit holding said output from said first internal circuit as timed by an externally applied trigger signal, and externally outputting a result of holding the output from said first internal circuit thus timed; wherein said first internal circuit outputs a plurality of internal signals; and said monitor circuit includes a plurality of hold circuits responsive to said trigger signal for holding said plurality of internal signals, respectively, and an output circuit detecting whether said plurality of hold circuits together hold said plurality of internal signals, as expected, and if so externally signaling accordingly.

2. The semiconductor memory device according to claim 1, wherein said output circuit includes:

an inverter inverting an output from any of said plurality of hold circuits expected to hold a low level; and an AND circuit receiving an output from said inverter and an output from any of said plurality of hold circuits expected to hold a high level.

3. The semiconductor memory device according to claim 1, wherein said hold circuit includes:

a first switch circuit responsive to said trigger signal for conducting to transmit said internal signal to a hold node;

a second switch circuit responsive to a reset signal for coupling said hold node with an initialization level; and a latch circuit holding a level of said hold node.

* * * * *